US008313612B2

(12) United States Patent
McMillin et al.

(10) Patent No.: US 8,313,612 B2
(45) Date of Patent: Nov. 20, 2012

(54) METHOD AND APPARATUS FOR REDUCTION OF VOLTAGE POTENTIAL SPIKE DURING DECHUCKING

(75) Inventors: Brian McMillin, Fremont, CA (US); Jose V. Tong, Fremont, CA (US); Yen-Kun Victor Wang, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 716 days.

(21) Appl. No.: 12/410,202

(22) Filed: Mar. 24, 2009

(65) Prior Publication Data
US 2010/0248490 A1 Sep. 30, 2010

(51) Int. Cl.
C23C 16/00 (2006.01)
C23C 16/50 (2006.01)
C23F 1/00 (2006.01)
H01L 21/306 (2006.01)

(52) U.S. Cl. ............ 156/345.54; 118/715; 118/728; 156/345.51

(58) Field of Classification Search .......... 118/728–733; 156/345.51–345.55
See application file for complete search history.

(56) References Cited

U.S. PATENT DOCUMENTS

| | | | |
|---|---|---|---|
| 2,969,042 A * | 1/1961 | Lynott et al. ............. 91/167 R |
| 5,380,566 A | 1/1995 | Robertson et al. | |
| 5,539,609 A | 7/1996 | Collins et al. | |
| 5,552,955 A | 9/1996 | Mashiro et al. | |
| 5,612,850 A | 3/1997 | Birang et al. | |
| 5,665,167 A | 9/1997 | Deguchi et al. | |
| 5,677,824 A | 10/1997 | Harashima et al. | |
| 5,684,669 A | 11/1997 | Collins et al. | |
| 5,699,223 A | 12/1997 | Mashiro et al. | |
| 5,708,556 A | 1/1998 | van O's et al. | |
| 5,793,192 A | 8/1998 | Kubly et al. | |
| 5,796,066 A | 8/1998 | Guyot | |
| 5,818,682 A | 10/1998 | Loo | |
| 5,838,528 A | 11/1998 | Os et al. | |
| 5,848,670 A | 12/1998 | Salzman | |
| 5,854,138 A | 12/1998 | Roth et al. | |
| 5,900,062 A | 5/1999 | Loewenhardt et al. | |
| 5,956,837 A | 9/1999 | Shiota et al. | |
| 5,997,962 A | 12/1999 | Ogasawara et al. | |
| 6,083,569 A | 7/2000 | Gupta et al. | |
| 6,090,304 A | 7/2000 | Zhu et al. | |
| 6,104,595 A | 8/2000 | Brown | |
| 6,125,025 A | 9/2000 | Howald et al. | |
| 6,140,612 A | 10/2000 | Husain et al. | |

(Continued)

FOREIGN PATENT DOCUMENTS

JP 2003-168643 A 6/2003

(Continued)

OTHER PUBLICATIONS

International Preliminary Report on Patentability issued Sep. 27, 2011 for PCT/IB2010/051137.

*Primary Examiner* — Parviz Hassanzadeh
*Assistant Examiner* — Tiffany Nuckols
(74) *Attorney, Agent, or Firm* — Buchanan Ingersoll & Rooney PC

(57) ABSTRACT

Provided is a substrate dechucking system of a plasma processing chamber adapted to remove a substrate from an ESC with reduction in voltage potential spike during dechucking of the substrate.

5 Claims, 9 Drawing Sheets

U.S. PATENT DOCUMENTS

| | | | |
|---|---|---|---|
| 6,185,085 B1 | 2/2001 | Hwang et al. | |
| 6,243,251 B1 | 6/2001 | Kanno et al. | |
| 6,251,793 B1 | 6/2001 | Wicker et al. | |
| 6,302,249 B1 * | 10/2001 | Jolly et al. | 188/269 |
| 6,391,787 B1 | 5/2002 | Dhindsa et al. | |
| 6,447,613 B1 | 9/2002 | Haraguchi et al. | |
| 6,465,043 B1 | 10/2002 | Gupta | |
| 6,481,723 B1 | 11/2002 | Hao et al. | |
| 6,628,500 B1 | 9/2003 | Thomas et al. | |
| 6,646,857 B2 | 11/2003 | Anderson et al. | |
| 6,669,783 B2 | 12/2003 | Sexton et al. | |
| 6,676,761 B2 | 1/2004 | Shang et al. | |
| 6,790,375 B1 | 9/2004 | Howald et al. | |
| 6,793,767 B2 | 9/2004 | Chu et al. | |
| 6,823,815 B2 | 11/2004 | Han et al. | |
| 6,824,627 B2 | 11/2004 | Dhindsa et al. | |
| 6,898,064 B1 | 5/2005 | Berman et al. | |
| 6,926,803 B2 | 8/2005 | Antolik | |
| 6,936,135 B2 | 8/2005 | Antolik | |
| 6,958,098 B2 | 10/2005 | Gujer et al. | |
| 6,984,288 B2 | 1/2006 | Dhindsa et al. | |
| 7,094,315 B2 | 8/2006 | Chen et al. | |
| 7,160,392 B2 | 1/2007 | Shang et al. | |
| 7,180,283 B2 | 2/2007 | Hunger et al. | |
| 7,223,321 B1 | 5/2007 | Comendant et al. | |
| 7,244,311 B2 | 7/2007 | Fischer | |
| 7,258,811 B2 | 8/2007 | Chu et al. | |
| 7,292,428 B2 | 11/2007 | Hanawa et al. | |
| 7,375,946 B2 | 5/2008 | White et al. | |
| 7,428,550 B2 | 9/2008 | Lakshminarayan et al. | |
| 2002/0190657 A1 | 12/2002 | Han et al. | |
| 2003/0038114 A1 | 2/2003 | Howald | |
| 2003/0079691 A1 | 5/2003 | Shang et al. | |
| 2003/0151371 A1 | 8/2003 | Fischer et al. | |
| 2003/0236004 A1 | 12/2003 | Sung et al. | |
| 2004/0112539 A1 | 6/2004 | Larson et al. | |
| 2004/0190215 A1 | 9/2004 | Weldon et al. | |
| 2005/0036268 A1 | 2/2005 | Howald et al. | |
| 2005/0070105 A1 | 3/2005 | Bailey, III et al. | |
| 2005/0133160 A1 | 6/2005 | Kennedy et al. | |
| 2006/0046506 A1 | 3/2006 | Fukiage | |
| 2006/0075969 A1 | 4/2006 | Fischer | |
| 2006/0162657 A1 | 7/2006 | Cirigliano | |
| 2007/0048882 A1 | 3/2007 | Kutney et al. | |
| 2008/0318433 A1 | 12/2008 | Dhindsa et al. | |

FOREIGN PATENT DOCUMENTS

| | | |
|---|---|---|
| KR | 10-0510920 | 8/2005 |
| KR | 10-0688988 B1 | 2/2007 |
| KR | 2008-0001336 A | 1/2008 |

* cited by examiner

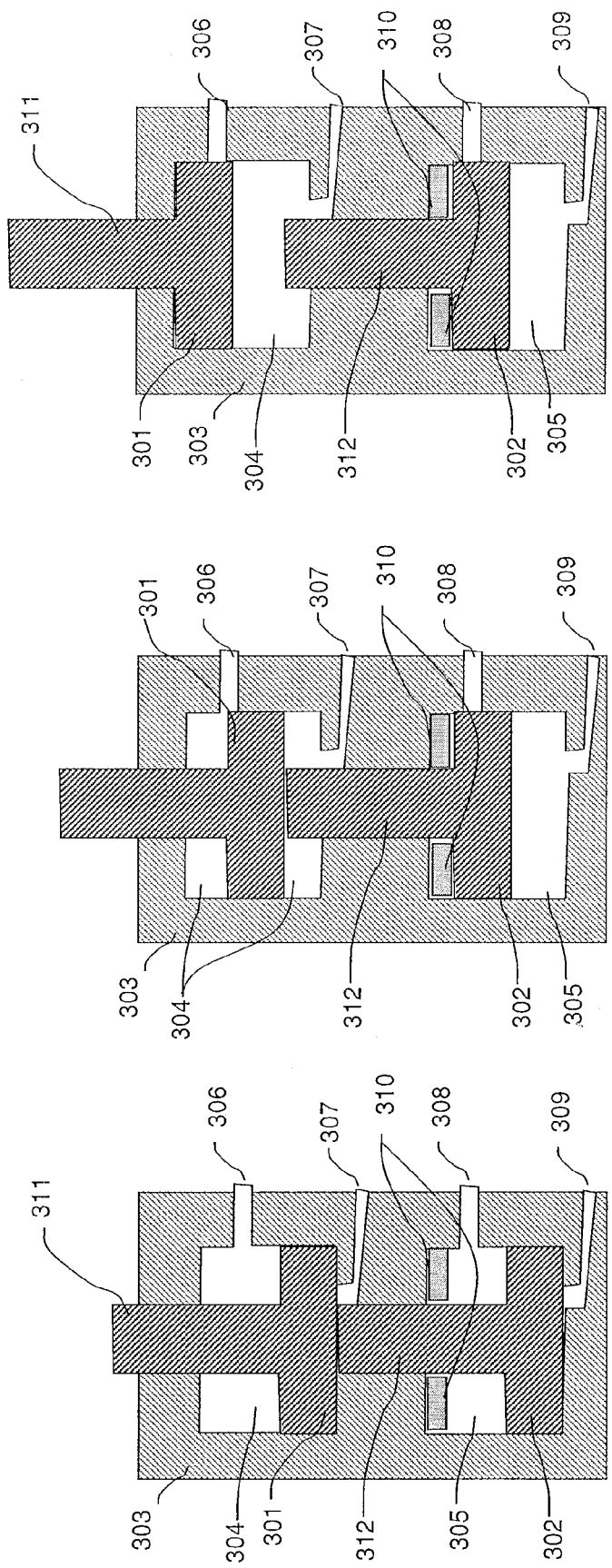

METHOD AND APPARATUS FOR REDUCTION OF VOLTAGE POTENTIAL SPIKE DURING DECHUCKING

BACKGROUND

Electrostatic chucks are used to hold semiconductor wafers and other substrates during processing such as plasma etching. An electrostatic chuck (ESC) uses an electrostatic potential to hold (clamp) a substrate in place during processing. By clamping the substrate to the chuck, a high thermal conductivity gas such as helium (He) may be disposed between the substrate and the chuck in order to improve heat transfer between the substrate and the chuck. The substrate is removed from the ESC by lift pins and a transfer arm removes the substrate from the processing chamber.

A difficulty that arises with the use of an ESC is the need for removal of the residual electrostatic force between the substrate and the chuck in order to remove the substrate from the chuck. This residual force results from the accumulation of electric charge at the interface between the substrate and the ESC support surface. Several techniques have been developed for removing or de-chucking a substrate. For example, the electrode can be grounded or, alternatively, the polarity of the chucking voltage applied to the electrode can be reversed in order to discharge the electrode. However, these techniques are not completely effective at removing all the charge on the electrode and the substrate. A mechanical force is often required to overcome the residual attractive electrostatic force, which can damage the substrate or create difficulty in retrieving the substrate from an unintended position. Further, undesired particles can be generated during the substrate dechucking and removal process which contaminate the processed substrate.

Despite the developments to date, there is an interest in apparatus and methods which reduce any voltage potential spike during dechucking of processed substrates.

SUMMARY

Provided is a substrate dechucking system of a plasma processing chamber adapted to remove a substrate from an ESC with reduction in voltage potential spike during dechucking of the substrate.

In a method of dechucking a substrate from an electrostatic chuck in a plasma processing chamber, a process gas is supplied into the chamber and energized into a plasma state, the plasma chamber is maintained at a vacuum pressure and low RF power to produce a plasma sheath above the substrate of 2 mm or greater thickness, the substrate is lifted above a support surface to a mid-lift position within the plasma sheath which does not induce plasma instability and maintained there, the plasma is extinguished, and the substrate is lifted above the mid-lift position to an upper position at which the substrate can be removed from the plasma chamber.

In another embodiment, a pneumatic lift mechanism for a plasma reactor is provided wherein lift pins raise and lower a substrate in at least three positions with respect to an electrostatic chuck. The lift mechanism preferably comprises vertically aligned pneumatically operated upper and lower pistons, wherein the upper piston is slidably mounted to move up and down in an upper chamber and the lower piston is slidably mounted to move up and down in a lower chamber, and the lower chamber comprises a hard stop defining an upper limit of travel of the lower piston. The at least three positions preferably comprise (1) a lower position at which the upper and lower pistons are in down positions; (2) a mid-lift position at which the lower piston is at an upper position in contact with the hard stop and a shaft extending upward from the lower piston contacts the upper piston to partially raise the upper piston; and (3) an up position at which the upper piston is an upper position and a substrate supported on lift pins driven by the upper piston can be removed from the plasma chamber. The upper piston includes an upper shaft which cooperates with a yoke driving lift pins to (1) lower a substrate onto a substrate support when the upper and lower pistons are in the lower position, (2) raise the substrate to a mid-lift position when the pistons are in the mid-lift position, and (3) raise the substrate to an upper position at which it can be removed by a transfer arm when the upper piston is in the upper position.

In a preferred method, the process chamber is a plasma etch chamber and the processing comprises generating a plasma adjacent the upper surface of the substrate and etching an exposed layer on the upper surface of the substrate with the plasma. Alternatively, the processing can comprise forming a layer on the upper surface of the substrate (e.g., by chemical vapor deposition, thermal oxidation, sputtering or other deposition processes). Still yet, the processing can comprise stripping photoresist or other material from the substrate.

BRIEF DESCRIPTION OF THE DRAWING FIGURES

FIG. 3A is a depiction of exemplary pneumatic lift hardware in a down position. FIG. 3B is a depiction of exemplary lift hardware in a mid-lift position. FIG. 3C is a depiction of exemplary lift hardware in an up position.

Figure 4:
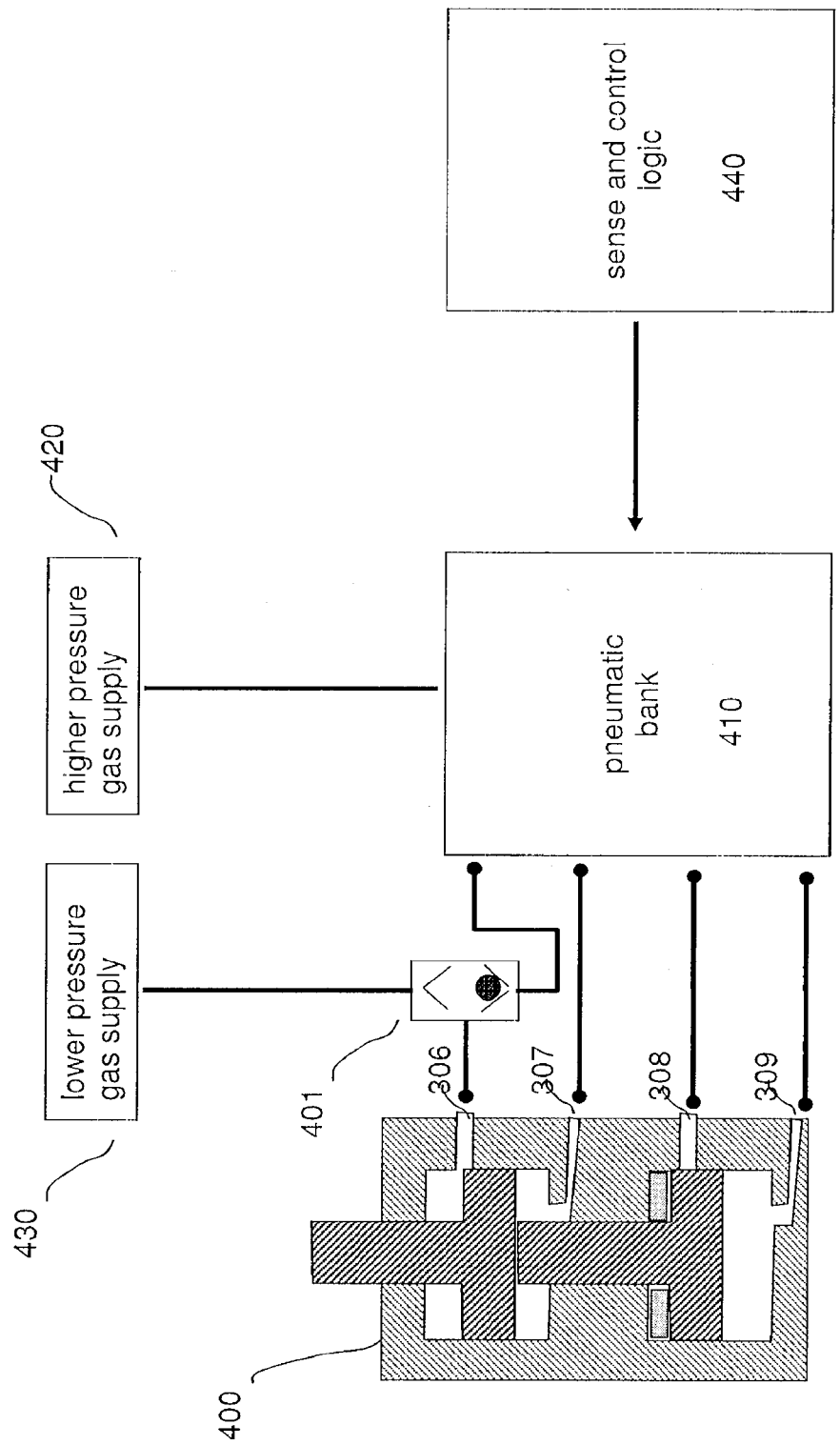

FIG. 4 is a schematic of an exemplary control system for pneumatic lift hardware.

Figure 5:
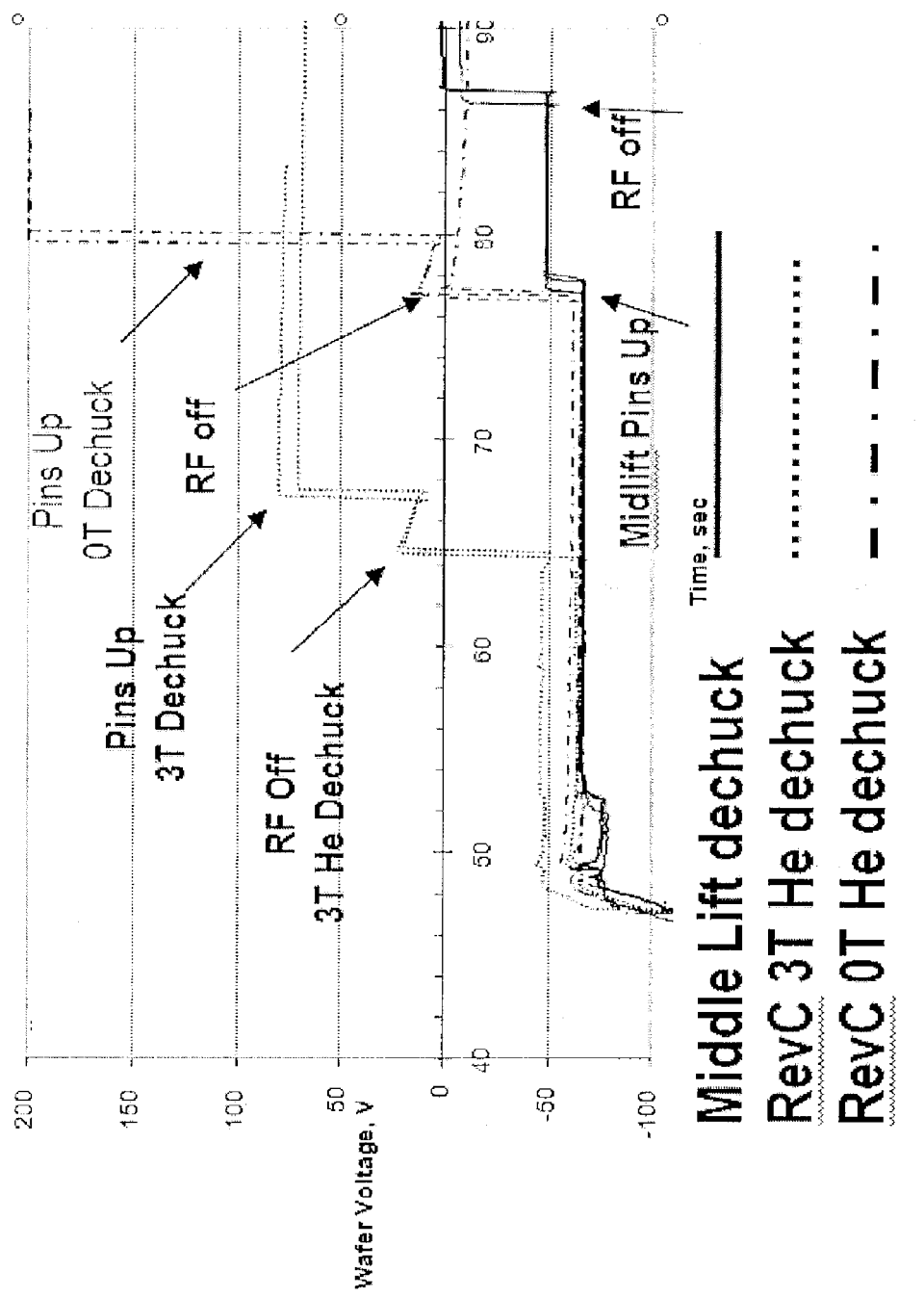

FIG. 5 shows substrate voltage when dechucked using various methods.

Figure 6A:
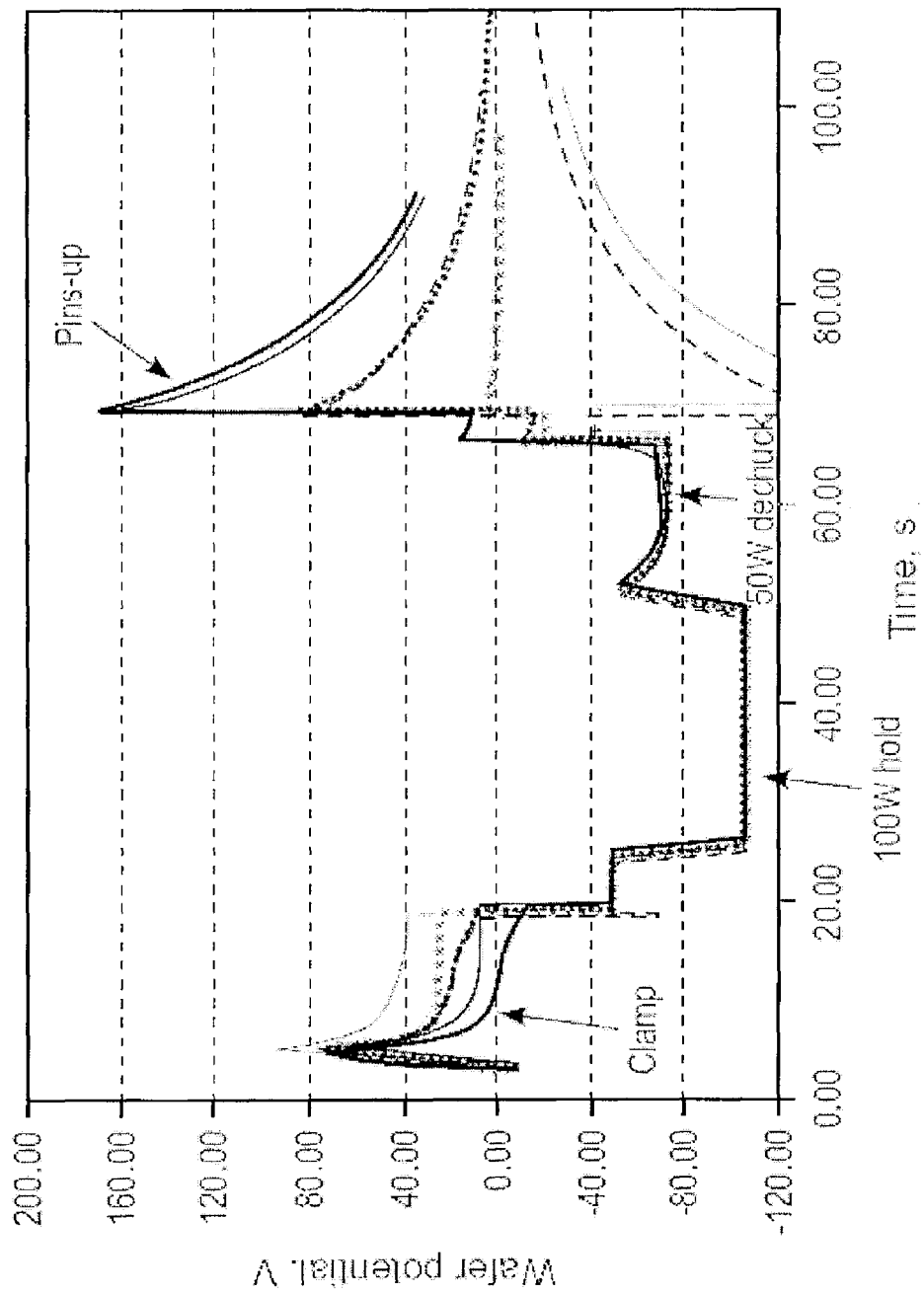
Figure 6B:
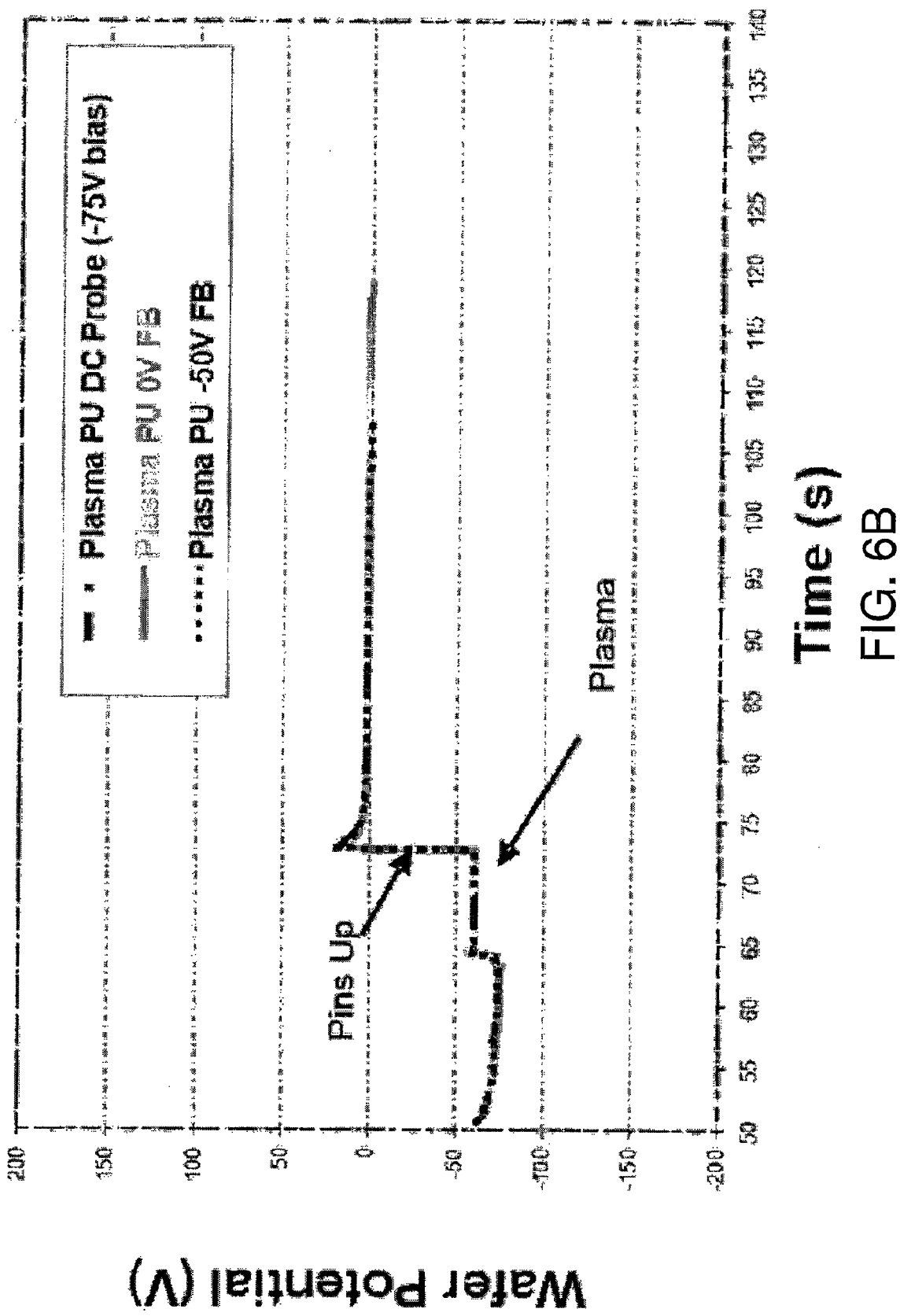

FIGS. 6A and 6B show substrate voltage when dechucking a substrate using various dechucking voltages, without and with a plasma-on dechucking step, respectively.

Figure 7:
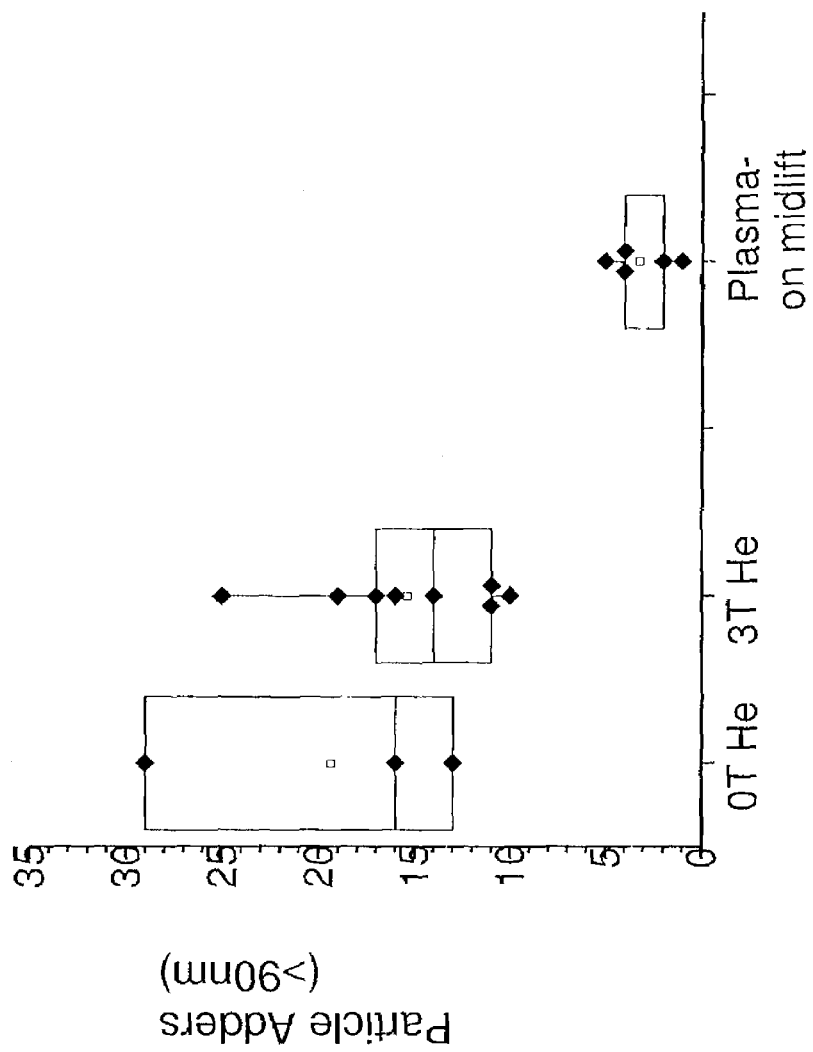

FIG. 7 shows particle contamination levels of substrates dechucked using various methods including or excluding helium backpressure and a midlift plasma-on step.

DETAILED DESCRIPTION OF PREFERRED EMBODIMENTS

As used herein, the term "about" when used in conjunction with a stated numerical value or range denotes somewhat more or somewhat less than the stated value or range, to within a range of ±10% of that stated.

A method of dechucking that is capable of reducing voltage potential spikes during dechucking from an ESC is described herein.

The substrate can comprise a semiconductor wafer used to manufacture integrated circuits, a substrate for 3-D chip integration, a glass substrate used to manufacture a flat panel display, or a silicon wafer bonded to a glass carrier.

Preferred embodiments are practiced in conjunction with a plasma reactor, such as a capacitively coupled plasma reactor, e.g., an Exelan™ plasma etcher, which is available from Lam Research Corporation of Fremont, Calif.

A preferred plasma reactor comprises a dual frequency capacitively coupled plasma reactor including an upper showerhead electrode and a bottom electrode, RF energy being supplied at two different frequencies (e.g., 27 MHz and 2 MHz) to the bottom electrode. See, for example, commonly-owned U.S. Pat. No. 6,391,787, the disclosure of which is hereby incorporated by reference in its entirety. In the case where the plasma reactor is a capacitively coupled plasma etch reactor, the bottom electrode is preferably supplied about 500 to 3000 Watts of RF energy, with optionally a lower wattage of 50 Watts during a dechucking operation.

Other preferred embodiments are practiced in conjunction with an inductively coupled plasma reactor. See, for example, commonly-owned U.S. Pat. No. 7,223,321, the disclosure of which is hereby incorporated by reference in its entirety. In operation of such a reactor, a reactant gas flows into a chamber and high frequency power is applied by an RF power supply to a coil, generating an electromagnetic field about the coil. The electromagnetic field is inductively coupled into the chamber and energizes reactant gas into a plasma.

Figure 1:
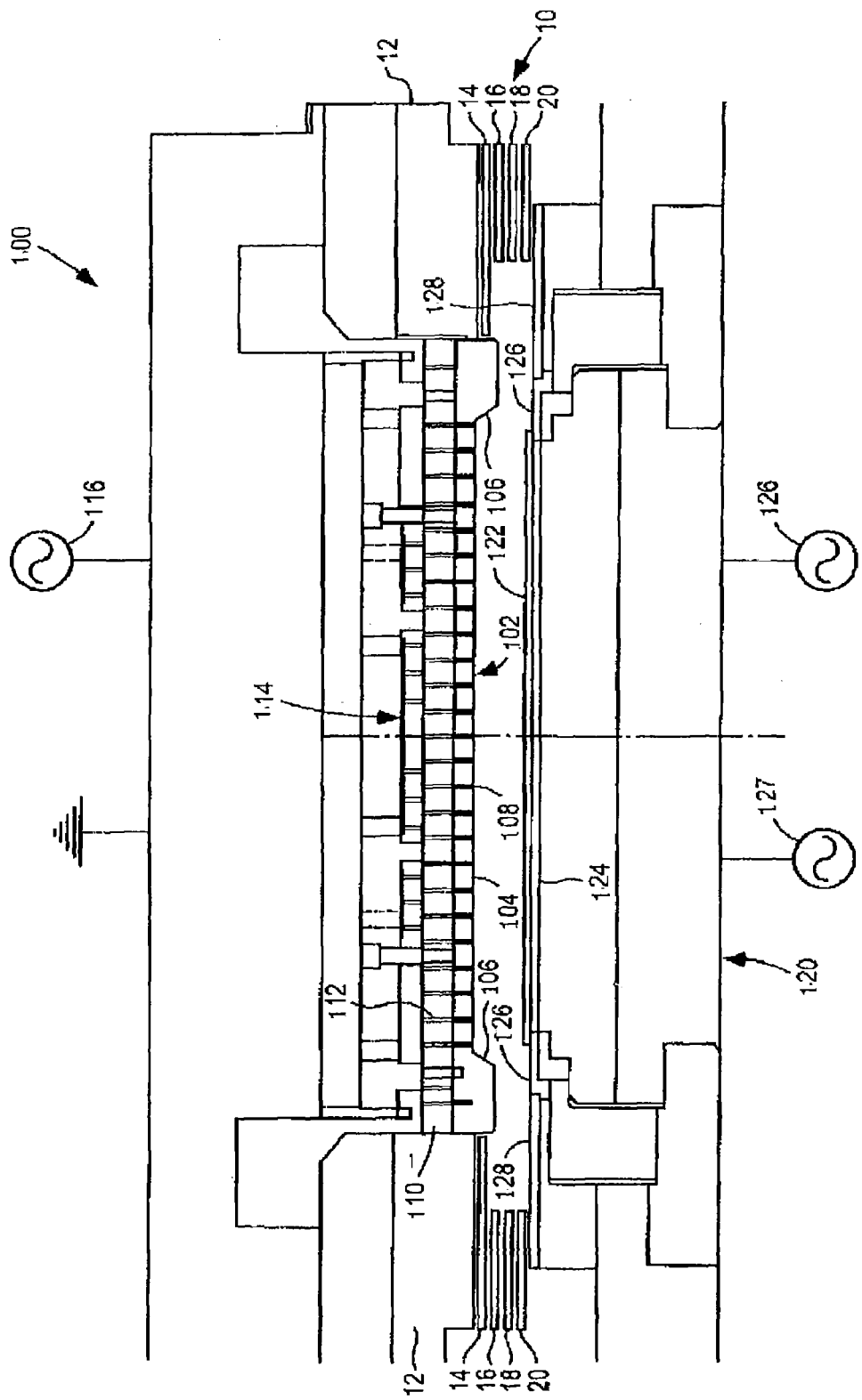
FIG. 1 is a side elevation view, in cross section, of a plasma reactor in accordance with one embodiment.

FIG. 1 illustrates a plasma reactor in accordance with one exemplary embodiment. Additional details regarding such a plasma reactor may be found in commonly-assigned U.S. Patent Publication No. 2008/0318433, which is incorporated herein by reference. It should be understood, however, that various configurations of the process chamber and internal components, including the lower and upper electrodes, chamber walls and process gas distribution system, may be used. See, for example, commonly-owned U.S. Pat. Nos. 6,824,627 and 7,428,550, each of which is incorporated herein by reference.

In FIG. 1, a capacitively-coupled plasma processing chamber 100 has a plasma confinement ring assembly 10 mounted therein. The plasma processing chamber 100 includes an upper electrode 102 having a bottom surface 104. In the embodiment, the bottom surface 104 includes a step 106 adapted to control a localized density of the plasma formed adjacent the exposed surface of the upper electrode 102, as described in U.S. Pat. No. 6,391,787, which is incorporated herein by reference in its entirety. In the embodiment, the upper electrode 102 is a showerhead electrode including gas passages 108 arranged for distributing process gas into the plasma processing chamber 100. The upper electrode 102 can be comprised of silicon (e.g., single crystal silicon or polycrystalline silicon) or silicon carbide.

In the embodiment, the upper electrode 102 is a single-piece electrode (e.g., for 200 mm wafer processing). The upper electrode 102 is preferably mounted (e.g., elastomer bonded) to a backing member 110 of a suitable material, such as graphite or silicon carbide. The backing member includes gas passages 112 in fluid communication with corresponding gas passages 108 in the upper electrode 102.

The upper electrode can be a planar electrode or a non-planar, stepped upper electrode such as a showerhead electrode as disclosed in commonly-owned U.S. Pat. No. 6,391,787. The RF electrodes can be made from any suitable electrically conductive material. For example, the upper electrode can comprise high purity, low resistivity single crystal and the lower electrode can comprise a metal such as silicon (e.g., doped silicon), aluminum and the like.

In another embodiment, the upper electrode can have a two-piece or segmented construction (e.g., for larger wafer processing, such as 300 mm wafers) and include a single-piece inner electrode member and an outer electrode member surrounding the inner electrode member, such as described in commonly-owned U.S. Patent Application Publication No. 2005/0133160, which is incorporated herein by reference in its entirety. In the embodiment, the backing member preferably includes a backing plate co-extensive with the inner electrode member and a backing ring co-extensive with the outer electrode member, as described in U.S. Patent Application Publication No. 2005/0133160.

In the embodiment of the plasma processing chamber 300 shown in FIG. 1, a thermal control plate 114 is preferably provided on the backing member 110. The thermal control plate 114 preferably includes one or more heaters adapted to control the temperature of the upper electrode 102, as described in commonly-owned U.S. Patent Application Publication No. 2005/0133160, incorporated herein by reference.

The plasma processing chamber 100 includes a gas source (not shown) for supplying process gas to the upper electrode 102. The process gas is distributed in the chamber by the gas passages 108 in the upper electrode 102. The upper electrode 102 can be powered by an RF power source 116 via a matching network. In another embodiment, the upper electrode 102 can be electrically grounded to provide a return path for power supplied by a bottom electrode of the substrate support 120 of the plasma processing chamber 100.

In the embodiment, process gas is supplied into the plasma processing chamber 100 at the plasma generation region in the space between the upper electrode 102 and a semiconductor substrate 122, e.g., a semiconductor wafer, supported on a substrate support 120.

In addition to a semiconductor wafer, the substrate 122 can comprise a glass panel to be processed into a flat panel display, or a silicon wafer carried by a glass substrate to be processed (e.g., for 3-D chip integration). The substrate 122 can comprise one or more layers to be selectively removed (etched) during processing or, alternatively, the processing can comprise forming one or more layers on the substrate or other process such as photoresist stripping.

The substrate support 120 preferably includes an electrostatic chuck 124 that secures the semiconductor substrate 122 on the substrate support by an electrostatic clamping force. The electrostatic chuck 124 can be incorporated in or mounted on a bottom electrode (also called a lower electrode) and can be powered by at least one of the RF power sources 126, 127 (typically via a matching network).

The lower electrode can be used to supply RF power to produce a plasma from process gas in the gap above the substrate and optionally apply an RF bias to the substrate. The amount of energy that is coupled between the upper and/or lower electrode and the plasma generally affects the density and energy of the plasma used to process the substrate. For example, if the coupled energy is large, the ion energy tends to be high. If the coupled energy is small, the ion energy tends to be low. Correspondingly, high ion energy tends to be more aggressive during substrate processing and a low ion energy tends to be less aggressive during substrate processing. The energy generated by the bottom electrode may also be arranged to form a sheath voltage proximate to the substrate surface, which is used to accelerate the ions in the plasma towards the substrate where they can activate the processing reaction.

Preferably, the outer periphery of the lower electrode is configured to extend beyond at least the outer edge of the wafer with an edge ring arranged above the lower electrode and surrounding the wafer.

During plasma processing of the semiconductor substrate 122, the plasma confinement ring assembly 10 confines plasma in a plasma confinement zone between the upper electrode 102 and the semiconductor substrate 122. Edge rings 126, 128 are preferably arranged in surrounding relationship to the semiconductor substrate 122 to focus the plasma so as to improve etch uniformity.

A vacuum pump (not shown), preferably a turbomolecular pump, is adapted to maintain a desired vacuum pressure inside the plasma processing chamber 300.

An exemplary parallel-plate plasma reactor that can be used is a dual-frequency plasma etch reactor (see, e.g., commonly-owned U.S. Pat. No. 6,090,304, which is hereby incorporated by reference in its entirety). In such reactors, etching gas can be supplied to a showerhead electrode from a gas supply and plasma can be generated in the reactor by supplying RF energy at different frequencies from two RF sources to the showerhead electrode and/or a bottom electrode. Alternatively, the showerhead electrode can be electrically grounded and RF energy at two different frequencies can be supplied to the bottom electrode.

To process a substrate, the substrate is loaded into the chamber, and placed on the support surface of the lower electrode. For example, a robot arm (not shown) can transport a substrate from a load-lock transfer chamber into the process chamber. A lift pin assembly (not shown) has lift pins that can be raised and lowered by a lift mechanism. Preferably the lift pins are electrically and thermally insulated from the lower electrode. Preferably the lift pins are made of sapphire, but can be metallic or dielectric. The robot arm can place the substrate on the tips of the lift pins and the lift mechanism can lower the substrate onto the support surface. After processing the substrate, the lift mechanism can raise the lift pins to lift the substrate off the lower electrode, allowing the substrate to be removed from the processing chamber via the robotic arm.

The lift pins can be raised and lowered by a pin lifter yoke such as that described in commonly-owned U.S. Pat. No. 6,646,857, the disclosure of which is hereby incorporated by reference. Alternatively, the lower electrode can also include lift-pins such as cable actuated lift pins movable towards and away from the support surface such that the lift-pins travel through holes in the lower electrode to raise and lower a substrate. A cable-actuated drive assembly for moving a substrate in a vacuum chamber is disclosed in commonly-owned U.S. Pat. No. 5,796,066, the disclosure of which is hereby incorporated by reference in its entirety. The number of lift pin holes generally depends on the size of the substrate. In a preferred embodiment, the lift pins are actuated by a gas, for example by using pneumatic lift hardware.

According to a preferred embodiment, a method of etching a substrate includes supporting the substrate on the lower electrode, supplying process gas to the chamber and energizing the process gas into a plasma and etching an exposed surface of the substrate with the plasma. The process is applicable to etching of various silicon and/or dielectric layers including low-k dielectric material such as doped silicon oxide such as fluorinated silicon oxide (FSG), undoped silicon oxide such as silicon dioxide, spin-on-glass (SOG), silicate glasses such as boron phosphate silicate glass (BPSG) and phosphate silicate glass (PSG), doped or undoped thermally grown silicon oxide, doped or undoped TEOS deposited silicon oxide, etc. Other materials that may be etched include organic low-k material such as BLACK DIAMOND available from Applied Materials, Inc. and the CORAL family of low-k films available from Novellus. The dielectric dopants include boron, phosphorus, and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc.

On 2300 Exelan™ systems, an ESC is used to hold silicon wafers on a temperature controlled bottom electrode during an oxide etch process. Wafer temperature control is effected by pressurized helium (He) supplied between the ESC upper surface and lower surface (backside) of the wafer. Details of a system for controlling helium backside cooling of wafers can be found in commonly-owned U.S. Pat. No. 6,140,612, the disclosure of which is hereby incorporated by reference. While He could be used to dechuck the wafer after the clamping voltage is no longer applied, He flowed during and immediately after dechucking can cause particles to migrate from the He interface between the ESC and backside of the wafer to the plasma etched surface and cause device damage to integrated circuitry fabricated on the frontside of the wafer.

To mitigate particle contamination of plasma processed substrates, the wafer can be exposed to plasma gas, which is believed to help minimize a change in substrate voltage potential during subsequent lifting of the substrate for removal from the plasma processing chamber. One method to accomplish this uses mechanical lift pins to partially raise the wafer to a mid-lift position, thus positioning the wafer at least partially within a plasma sheath.

Optionally, low helium backpressure (e.g., 5 Torr or less) can be applied to slightly separate the wafer while the dechucking plasma is on, but turned off before the plasma is extinguished. If the He remains applied while the plasma is extinguished, backside particles can be transported to the front side of the wafer by helium flow.

In an embodiment, after voltage to the ESC is turned off and the supply of He to the He interface is terminated, lift pins are raised to lift the substrate off of the ESC while plasma is maintained in the chamber. The substrate is maintained in the plasma sheath while preventing penetration of the plasma beneath the wafer and preventing plasma instability.

Subsequently, the plasma is extinguished and the substrate is raised to an upper position at which the substrate can be transferred out of the chamber.

Although described in embodiments, no force sensor or application of dechucking voltage is required for dechucking. However, if desired, either or both may be employed.

In accordance with a preferred embodiment, a method of dechucking a substrate from an electrostatic chuck in a plasma processing chamber comprises: supplying process gas into a gap between an upper electrode and a bottom electrode on which the substrate is held against a support surface by the electrostatic chuck, energizing the process gas in the gap into a plasma state by supplying radio frequency power (for example, to a lower electrode or a coil); maintaining the plasma chamber at a vacuum pressure which provides a plasma sheath above the lower electrode; lifting the substrate above the support surface to a mid-lift position within the plasma sheath which does not induce plasma instability or allow plasma penetration beneath the wafer; maintaining the substrate at the mid-lift position for a suitable time such as 2 to 30 seconds; and lifting the substrate above the support surface to an upper position at which the substrate can be removed from the plasma chamber.

In accordance with various optional features of the method, the process gas can be argon, nitrogen or a mixture thereof. The substrate is preferably lifted by lift pins made of electrically insulating material (for example, sapphire) which lift the substrate 0.5 to 3 mm (e.g., 1.5 to 2 mm) above the support surface of the electrostatic chuck in the mid-lift position. The substrate can be a wafer of silicon or other material and may have at least one layer of dielectric material.

Prior to lifting the substrate, voltage to the electrostatic chuck is preferably set to a predetermined value relative to the bias expected to have been induced on the wafer by the plasma, and a supply of He gas to the underside of the substrate is terminated. The gap between the upper and lower electrodes can be any suitable distance such as at least 20 mm and vacuum pressure in the chamber can be any suitable value such as a value in the range of 15 to 500 mTorr, for example up to 25, 50, 100, 150, 200, 250, or 300 mTorr. When the substrate is lifted to the upper position, the substrate is preferably lifted to at least 9 to 15 mm (e.g., 9.5 to 12.5 mm) above the support surface.

Figure 2A:
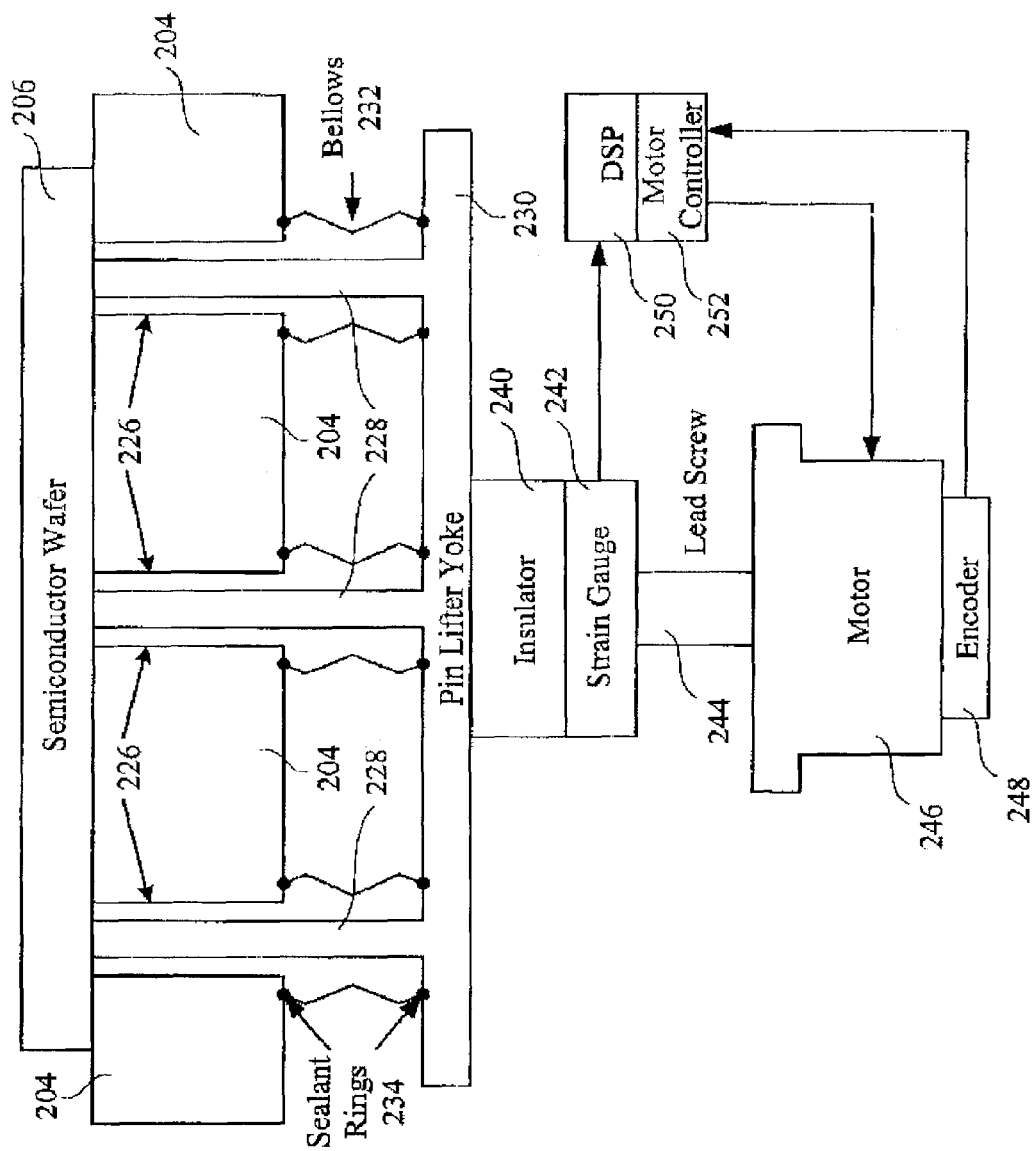
FIG. 2A is a depiction of a substrate pin-lift system wherein the system is supported on an ESC.

FIG. 2A shows a cross sectional view of a semiconductor wafer lifting device which can be used to carry out the wafer dechucking method described above. Additional details regarding such a device may be found in commonly-assigned U.S. Pat. No. 6,646,857, the entirety of which is incorporated herein by reference. The semiconductor wafer lifting device includes a number of lifting pins 228 which traverse electrostatic chuck 204 through a suitable number of penetrations 226 depending on the size of the substrate. Typically, there are either 3 or 4 lifting pins 228 which are equidistant apart and connected to lifting yoke 230. The space between the lifting pins 228 and the electrostatic chuck 204 is isolated from the space below the chuck by bellows 232 and sealant rings 234. Use of bellows 232 allows the yoke 230 to move with respect to the chuck 204 without compromising the atmospheric isolation within the processing chamber. A strain gauge 242 is positioned between insulating material 240 and a lead screw 244 which is driven by a motor 246 to move the yoke 230. It should be noted that the lead screw 244 can be replaced with any type of link, such as a pneumatic lift mechanism, so long as it is able to raise and lower the pin lifter yoke 230.

The strain gauge 242 sends information signals to a controller such as a digital signal processor (DSP) 250, which in turn sends signals to a motor controller 252, which in turn sends signals to the motor 246 for controlling the positioning of the lead screw 244. An encoder 248 is interfaced with the motor 246 and is configured to send signals to the motor controller 252. The information provided by the encoder 248 will contain current position data for the lead screw 244.

The lifting pins 228 are configured to contact the underside of the wafer 206 and apply a low force, especially during the mid-lift process, in order to prevent the application of high stresses that can have the potential of damaging the wafer while it is electrostatically clamped to the chuck 204.

The lifting yoke 230 can be moved incrementally upward to lift the wafer 206 from the chuck 204. As the lifting pins 228 experience forces resistant to lifting of the wafer 206, these forces will be transferred through the lifting yoke 230 to the optional strain gauge 242. The strain measurement from the strain gauge 242 will in turn be monitored by the DSP 250. If the monitored strain force is not within an acceptable range, the DSP 250 (and associated software, if necessary) will instruct the motor controller 252 to stop incrementing the motor and timeout to allow electrostatic discharge of the wafer 206, such that electrostatic attraction between the wafer 206 and chuck 204 may be further reduced. The stopping of the incrementing occurs when a threshold value is reached. The threshold value is preferably a set value that identifies when the force applied by the lift pins has reached a level that might cause damage to the wafer. Thus, the threshold value is just below that level that might cause wafer damage, and in this manner, the wafer is protected from excessive forces when sufficient discharge has not taken its course.

The acceptable force limit under gravity can range between about 1 ounce and about 5 pounds, depending on the size of the wafer. If the monitored force is within an acceptable range, the DSP 250 and associated software will instruct the motor controller 252 to continue incrementing the motor. During the incrementing, the encoder 248 attached to the motor 246 will monitor the position of the lead screw 244 and signal the lead screw position to the motor controller 252. The motor controller 252 will then instruct the motor 246 to stop lifting the yoke 230 when the desired lifting height is attained.

Figure 2B:
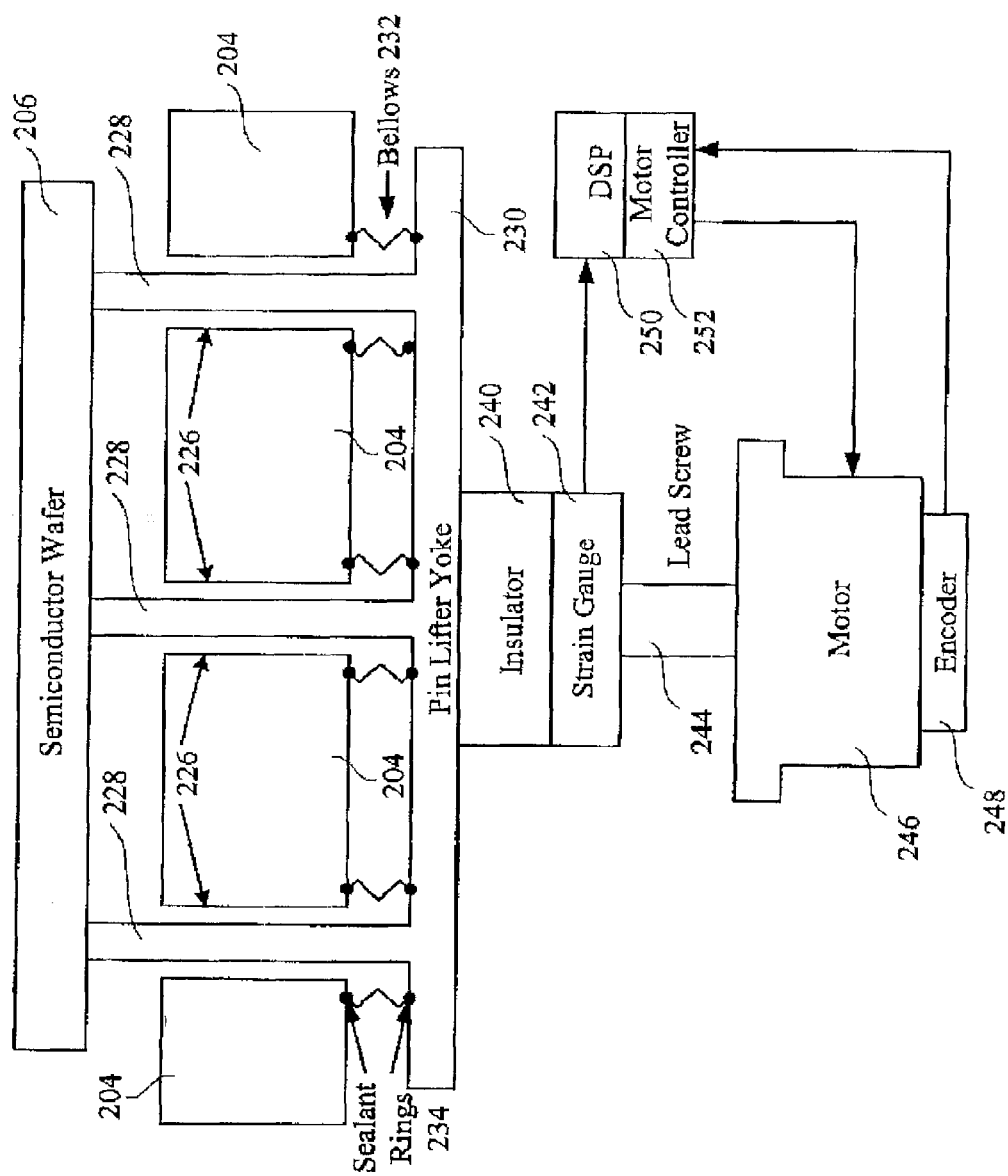
FIG. 2B is a depiction of the pin-lift system of FIG. 2A wherein the substrate has been lifted above the ESC.

FIG. 2B shows a cross sectional view of a semiconductor wafer lifting device as the lifting pins 228 lift the wafer 206. The components shown in FIG. 2B are identical to those shown and described in FIG. 2A. FIG. 2B illustrates the movement of the lifting yoke 230 as the wafer 206 is lifted off of the chuck 204 to the mid-lift position and then to the upper position as discussed above. At this point, the wafer 206 will be ready to be picked off of the lifting pins 228 by the blade of a robot. Now, another wafer 206 can be placed on the lifting pins 228 so that it can be lowered onto the chuck 204 for processing.

In an alternative embodiment, a pneumatic pin lifter can be used in place of the motor 246 and lead screw 244 to control the stroke of the pin lifting mechanism. For example, a drive system operated by a separate pressurized gas source (exemplary gases including air, argon, helium, and nitrogen) could be used to move the pin lifter yoke and lift pins to an upper position at which the substrate can be transferred onto and removed from the lift pins by a transport arm that transfer substrates into and out of the plasma chamber, a lower position at which the substrate can be clamped by the ESC, and a mid-lift position at which the substrate is held within the plasma sheath. Lifting can be accomplished by the use of lift hardware as described below with reference to FIGS. 3A-C.

A pin-lift mechanism can be operated under the control of a controller which monitors the position of the lift pins and directs the pin lift mechanism to raise or lower the lift pins to at least upper (also referred to as "full up" or simply "up"), mid-lift, and lower positions. Preferably, a lift mechanism includes one or more position sensors, more preferably optical sensors to detect when the mechanism is in mid-lift and up positions. Such optical sensors may detect movement of the yoke or of one or more flags affixed to the yoke.

An exemplary lift mechanism for use in a plasma reactor is depicted in FIGS. 3A, 3B, and 3C. Such a mechanism may replace the motor and associated components in FIGS. 2A and 2B. An upper piston 301 and a lower piston 302 are slidably mounted in an upper chamber 304 and a lower chamber 305, respectively, all in a housing 303. The upper piston 301 includes a vertically extending upper shaft 311 which is preferably operably connected to a pin lifter yoke (not shown). The lower piston 302 includes a vertically extending lower shaft 312 that may act to partially raise the upper piston. The chambers 304 and 305 are preferably stationary with respect to the ESC due to fixedly mounting housing 303. Such a lift mechanism does not require the use of a strain gauge or the like (such as a force sensor), however one may be used, for example between the upper shaft 311 and a pin lifter yoke.

Actuation of the lift mechanism to a down position, as shown in schematic form in FIG. 3A, is accomplished by applying gas pressure (e.g., 70 to 120 psig, preferably 90 psig) through a first inlet 306 to pressurize an upper portion of the upper chamber 304. This pressure exerts a downward force against the upper piston 301, and forces the yoke and its lift pins to a down position with the upper ends of the lift pins below the ESC upper surface. Preferably, 90 psig or a lower pressure such as 50 psig is also applied through inlet 308 to the top of lower chamber 305, to ensure that the lower piston 302 does not lift the upper piston 301.

Actuation to a mid-lift position, as shown in schematic form in FIG. 3B, is accomplished by applying gas pressure (e.g., 25-65 psig, preferably 50 or 60 psig) through first inlet 306 to the top of upper chamber 304 while applying higher gas pressure (e.g., 70 to 120 psig, preferably 90 psig) to fourth inlet 309 to the bottom of lower chamber 305. The lower piston 302 is thus raised a predetermined distance based upon location of a hard stop 310 at the top of lower chamber 305, where preferably the hard stop 310 has been pre-adjusted in order desirably determine the mid-lift position. The lower shaft 312 of lower piston 302 in turn pushes upper piston 301 to a corresponding partially raised position so that a wafer is raised to a mid-lift position above the ESC so as to be within a plasma sheath without inducing plasma instability. A third inlet 308 may vent the top of lower chamber 305 and, optionally in a lowering step, be pressurized to lower the lower piston 302 prior to lowering the upper piston 301.

Actuation to a full up position (to facilitate removal of a wafer), as shown in schematic form in FIG. 3C, is accomplished by applying gas pressure (e.g., 60 to 120 psig, preferably 90 psig) through second inlet 307 to a lower portion of top chamber 304 while applying 50 psig (or optionally 65, 70, or 75 psig) through a first opening 306 to pressurize an upper portion of a top chamber 304, thereby raising upper shaft 301.

The opposing pressure applied to the top of the upper chamber during mid-lift and full-up actuation is used to limit max up force in the event that the wafer is not well dechucked (for example, if the wafer exhibits an unexpectedly high attraction to the chuck) and thus minimize risk of breaking a wafer. The opposing pressure also reduces sudden forces on the wafer which could dislodge the wafer from a desired positional relationship with the lift pins. Optionally, the force applied to the lift pins may be used as an indicator that a dechuck has been performed.

Preferably, the mid-lift position raises the wafer about 0.5 to 3 mm (e.g., 2 mm to 3 mm) above the ESC and the up position raises the wafer about 9.5 mm (0.375 inches) to 12.5 mm (0.433 inches) above the ESC.

In a preferred embodiment, the pressures used to supply the lift mechanism come from supply lines, for example separate 50 psig (or optionally 65, 70, or 75 psig) and 90 psig gas supply lines. Supply of the gas to inlets 306-309 may be controlled by electronically-controlled on-off valves. Preferably, such valves are activated to open or closed positions by a controller, for example a controller that also controls other operational aspects of the plasma reactor.

FIG. 4 shows a schematic of an exemplary control system for pneumatic actuator hardware. A pneumatic actuator 400 has its second through fourth inlets 307, 308, and 309 each connected to a pneumatic bank 410 and its first inlet 306 connected to shuttle valve 401. The pneumatic bank comprises controllable valves. It receives higher pressure gas (e.g., 60 to 120 psig, preferably 90 psig) from a higher pressure gas supply 420 and is controlled by sense and control logic controller 440 to supply gas as desired to the inlet ports 307, 308, and 309 and to shuttle valve 401. The shuttle valve 401, in addition to receiving gas when sent from the pneumatic bank, is also connected to receive gas from a lower pressure gas supply 430 (which provides 50 psig, or optionally 65, 70, or 75 psig). The shuttle valve 401 preferably operates to automatically supply the higher of the received pressures to first inlet 306 (i.e., it supplies the lower pressure gas by default, or the higher pressure gas when the pneumatic bank 410 supplies the higher pressure gas to the valve 401), or less preferably the valve 401 can be controlled independently from bank 410. The sense and control logic controller 440 may receive inputs from optional sensors (not shown), for example to detect the position of a yoke.

A lift mechanism for implementing a mid-lift step may be used with or without a dechucking voltage to the ESC and wafer and with or without supplying He gas to the underside of the wafer. If a dechucking voltage is used, the voltage is preferably set to a value within 200V of the bias voltage induced on the wafer by the plasma prior to lifting the wafer, e.g., −200 V to +200 V, including zero. For a 300 mm EXELAN, the preferred dechucking voltage is −50V for a 50 W 27 MHz plasma at 50 mTorr, as is within about 20V of the measured bias voltage on the wafer. The use of a dechucking voltage alone (without a plasma-on substrate discharging step, for example as part of a mid-lift step) may present difficulties, in that polarity and magnitude of a dechucking voltage sufficient to eliminate residual charge on the substrate varies with the type of substrate, substrate temperature, dechuck recipe, etc., so that determination of a dechucking voltage optimal to eliminate substrate charge must be repeated each time reactor process conditions change, which is time-consuming. Unless the substrate charge is neutralized, the dechucking process may cause the voltage on the substrate to spike during wafer lift, which could electrostatically attract contaminants to adhere to the substrate.

A helium backpressure of 1 to 10 Torr on the underside of the wafer can be used to slightly lift the wafer to a mid-lift position wherein the wafer is at least partially within the plasma sheath. If helium backpressure is used, a preferred pressure is 2-5 Torr, preferably 3 Torr. However, in a preferred embodiment, 0 Torr helium backpressure is used in the dechuck step prior to a plasma-on midlift of the wafer.

FIG. 5 shows test results of wafer voltage during dechucking from an ESC. The line of alternating dots and dashes shows wafer voltage for a plasma dechuck at 0 Torr helium backside pressure followed by a plasma-off lift (labeled "0T He dechuck"); the dotted line shows wafer voltage for a plasma dechuck with 3 Torr helium backside pressure followed by a plasma-off lift (labeled "3T He dechuck"), and the solid line shows wafer voltage for a plasma dechuck at 0 Torr helium backside pressure followed by a plasma-on mid-lift dechucking step wherein the wafer is lifted above a support surface of the ESC to a mid-lift position within a plasma sheath (labeled "Middle Lift dechuck"). Note that "Pins Up" times are staggered in the chart for readability. The Tables below provide additional details regarding the parameters under which these tests were performed.

It can be seen that the use of a plasma-on mid-lift to a wafer position within the plasma sheath minimized the voltage spike seen by the wafer during the lifting of the wafer. In contrast, if the RF power is turned off before the lifting of the wafer, a large voltage spike occurs. Using a helium 3T backpressure during the dechuck plasma reduces the size of the voltage spike compared to no backpressure, when the wafer lift occurs with no plasma.

Table 1 below shows plasma chamber operational parameters used in the test of the plasma-on mid-lift step during dechucking. In this Table and the other tables, "ME" represents "main etch," "DCProbe" refers to measured wafer bias voltage (which can be used to set the voltage applied to the ESC), "DC1" represents "Dechuck 1" (an initial reduced power setting at the start of the dechuck process, allowing the plasma reactor to stabilize), and "DC2" represents "Dechuck 2" (showing power settings during dechucking).

TABLE 1

Mid-lift dechuck.

| Step Description | Stability | Strike | ME | DC1 | DC2 | MidLift | RF Off |
|---|---|---|---|---|---|---|---|
| Pressure (mtorr) | 120 | 120 | 100 | 0 | 50 | 50 | 0 |
| RF 2 MHz Power (w) | 0 | 50 | 100 | 1 | 0 | 0 | 0 |
| RF 27 MHz Power (w) | 0 | 50 | 100 | 50 | 50 | 50 | 0 |
| Step Type | Stab | Time | Time | Time | Time | Time | Time |
| Process Time (sec) | 20 | 5 | 25 | 4 | 16 | 10 | 2 |
| $C_4F_8$ (50.0 sccm) | 13 | 13 | 13 | 0 | 0 | 0 | 0 |
| CO (510.0 sccm) | 65 | 65 | 65 | 0 | 0 | 0 | 0 |
| $O_2$ (52.0 sccm) | 8 | 8 | 8 | 0 | 0 | 0 | 0 |
| Ar (1010.0 sccm) | 800 | 800 | 800 | 400 | 400 | 400 | 400 |
| Helium Inner Zone (torr) | 30 | 30 | 30 | 30 | 0 | 0 | 0 |
| Helium Outer Zone (torr) | 30 | 30 | 30 | 30 | 0 | 0 | 0 |
| ESC Bias Mode | Fixed | Fixed | DCProbe | DCProbe | Fixed | Fixed | DCProbe |
| ESC Bias Voltage (±Vdc) | 200 | 200 | 0 | 0 | −50 | −50 | 0 |
| ESC Full Time Bias Comp | Enable | Enable | Disable | Enable | Enable | Enable | Enable |
| Lifter Pin Position | down | down | down | down | down | middle | middle |

Table 2 below shows plasma chamber operational parameters used in the 0T He dechuck test, without a plasma-on mid-lift step.

TABLE 2

0T He dechuck.

| Step Description | Stability | Strike | ME | DC1 | DC2 | Delay | MiddleLift |
|---|---|---|---|---|---|---|---|
| Pressure (mtorr) | 120 | 120 | 100 | 0 | 50 | 0 | 0 |
| RF 2 MHz Power (w) | 0 | 50 | 100 | 1 | 0 | 0 | 0 |
| RF 27 MHz Power (w) | 0 | 50 | 100 | 50 | 50 | 0 | 0 |
| Step Type | Stab | Time | Time | Time | Time | Time | Time |
| Process Time (sec) | 20 | 5 | 25 | 4 | 16 | 2 | 2 |
| $C_4F_8$ (50.0 sccm) | 13 | 13 | 13 | 0 | 0 | 0 | 0 |
| CO (510.0 sccm) | 65 | 65 | 65 | 0 | 0 | 0 | 0 |
| $O_2$ (52.0 sccm) | 8 | 8 | 8 | 0 | 0 | 0 | 0 |
| Ar (1010.0 sccm) | 800 | 800 | 800 | 400 | 400 | 0 | 400 |
| Helium Inner Zone (torr) | 30 | 30 | 30 | 30 | 0 | 0 | 0 |
| Helium Outer Zone (torr) | 30 | 30 | 30 | 30 | 0 | 0 | 0 |
| ESC Bias Mode | Fixed | Fixed | DCProbe | DCProbe | DCProbe | DCProbe | DCProbe |
| ESC Bias Voltage (±Vdc) | 200 | 200 | 0 | 0 | 0 | 0 | 0 |
| ESC Full Time Bias Comp | Enable | Enable | Disable | Enable | Enable | Disable | Enable |
| Lifter Pin Position | down | down | down | down | down | down | middle |

Table 3 below shows plasma chamber operational parameters used in the 3T He dechuck test, without a plasma-on mid-lift step.

TABLE 3

3T He dechuck.

| Step Description | Stability | Strike | ME | DC1 | DC2 | Delay | MiddleLift |
|---|---|---|---|---|---|---|---|
| Pressure (mtorr) | 120 | 120 | 100 | 0 | 50 | 0 | 0 |
| RF 2 MHz Power (w) | 0 | 50 | 100 | 1 | 0 | 0 | 0 |
| RF 27 MHz Power (w) | 0 | 50 | 100 | 50 | 50 | 0 | 0 |
| Step Type | Stab | Time | Time | Time | Time | Time | Time |
| Process Time (sec) | 20 | 5 | 25 | 4 | 15.5 | 2 | 2 |
| $C_4F_8$ (50.0 sccm) | 13 | 13 | 13 | 0 | 0 | 0 | 0 |
| CO (510.0 sccm) | 65 | 65 | 65 | 0 | 0 | 0 | 0 |
| $O_2$ (52.0 sccm) | 8 | 8 | 8 | 0 | 0 | 0 | 0 |
| Ar (1010.0 sccm) | 800 | 800 | 800 | 400 | 400 | 0 | 400 |
| Helium Inner Zone (torr) | 30 | 30 | 30 | 30 | 3 | 3 | 0 |
| Helium Outer Zone (torr) | 30 | 30 | 30 | 30 | 3 | 0 | 0 |
| ESC Bias Mode | Fixed | Fixed | DCProbe | DCProbe | DCProbe | DCProbe | DCProbe |
| ESC Bias Voltage (±Vdc) | 200 | 200 | 0 | 0 | 0 | 0 | 0 |
| ESC Full Time Bias Comp | Enable | Enable | Disable | Enable | Enable | Disable | Enable |
| Lifter Pin Position | down | down | down | down | down | down | middle |

FIG. 6A shows that the wafer voltage potential spike at pins up can be controlled for a plasma-off lift by adjusting the dechuck voltage. The two dark solid lines (a thick line and a thin line) show the results of two runs where the dechuck voltage was −50V, which resulted in large positive voltage spikes at dechuck. The lighter-color solid line and the line composed of long dashes show the results of two runs where the dechuck voltage was 0V, which resulted in large negative voltage spikes at dechuck. The three other lines (composed of short dashes, dots, and stars) show the results of three runs where the dechuck voltage was −25V, which resulted in smaller voltage spikes at dechuck as compared to the other examples. By proper choice of the dechuck voltage applied to the ESC, the wafer voltage spike at pins up can be minimized. These tests were performed with a plasma-on dechucking step followed by a plasma-off lift.

In contrast, FIG. 6B shows wafer voltage potential at various dechuck voltages during dechuck with the plasma on during a mid-lift step. In this case, with plasma on during pins up, the wafer potential spike at pins up is more consistently low (<25V in magnitude) and relatively insensitive to the dechuck voltage value when compared to FIG. 6A. Thus, it is expected that a mid-lift step should be useful in reducing voltage spikes in a variety of situations which might require differing dechuck voltages.

FIG. 7 shows particle contaminants measured on wafers dechucked with and without 3T helium backpressure and a dechucking plasma on, but without a plasma-on midlift step (columns A and B, respectively), or when using a plasma-on mid-lift step in the dechuck process (column C). Using the midlift plasma dechuck (with 0 Torr He during the plasma dechuck and plasma-on midlift) recipe results in lower particle counts compared to 3 Torr He plasma-off dechuck.

Lower particle counts with midlift plasma dechuck are partly explained due to reduced particle transport by electrostatic attraction to the wafer as a result of a lower voltage spike, and, in part, by the reduction of He flow transport of backside particles achieved by using 0 Torr He backside pressure during the dechuck and lift. For example, negatively charged wafer backside particles and particles on the adjacent edge ring are less likely to be attracted to the wafer during the lift if positive wafer potential is minimized.

Although the invention has been described with reference to particular embodiments and examples, it should be understood that various modifications can be made without departing from the spirit of the invention. The various parts of the disclosure including the abstract, summary, and the title are not to be construed as limiting the scope of the present invention, as their purpose is to enable the appropriate authorities, as well as the general public, to quickly determine the general nature of the invention. Unless the term "means" is expressly used, none of the features or elements recited herein should be construed as means-plus-function limitations. Accordingly, the invention is limited only by the claims.

What is claimed is:

1. A pneumatic lift mechanism for a plasma reactor wherein lift pins raise and lower a substrate in at least three positions with respect to an upper surface of an electrostatic chuck, the lift mechanism comprising:
   a housing having an upper chamber and a lower chamber;
   an upper piston slidably mounted to move up and down in the upper chamber;
   a lower piston slidably mounted to move up and down in the lower chamber, the lower chamber comprising a hard stop defining an upper limit of travel of the lower piston;
   the at least three positions comprising (1) a lower position at which the upper piston positions the lift pins below the upper surface of the electrostatic chuck, (2) a mid-lift position at which the lower piston is in contact with the hard stop and a shaft of the lower piston raises the upper piston, and (3) an up position at which the upper piston positions the lift pins so the substrate can be removed from the plasma chamber; and
   wherein the upper piston and the lower piston are independently pneumatically operated.

2. The lift mechanism of claim 1, further comprising a lift pin yoke operably connected to a shaft extending upward from the upper piston.

3. The lift mechanism of claim 1, wherein:
   the housing includes gas inlets operably connected to pressurized gas sources, the gas inlets including a first gas inlet in fluid communication with a portion of the upper chamber above the upper piston, a second gas inlet in fluid communication with a portion of the upper chamber below the upper piston, a third gas inlet in fluid communication with a portion of the lower chamber above the lower piston, and a fourth gas inlet in fluid communication with a portion of the lower chamber below the lower piston; and
   an up force on the upper piston is limited by an opposing pneumatic pressure provided by pressurized gas supplied to the first inlet.

4. The lift mechanism of claim 3, wherein:
   the first gas inlet is in fluid communication with a first gas source supplying gas at a pressure of 25 to 65 psig and the second, third, and fourth gas inlets are in fluid communication with a second gas source supplying gas at a pressure of 70 to 120 psig, and
   the lift mechanism further comprises a controller operable to selectively supply gas from the first and second gas sources to the gas inlets.

5. The lift mechanism of claim 4, further comprising a valve operating to place the first gas inlet in fluid communication with either the first gas source or the second gas source.

* * * * *